US006573129B2

(12) United States Patent
Hoke et al.

(10) Patent No.: US 6,573,129 B2
(45) Date of Patent: Jun. 3, 2003

(54) GATE ELECTRODE FORMATION IN DOUBLE-RECESSED TRANSISTOR BY TWO-STEP ETCHING

(75) Inventors: William E. Hoke, Wayland, MA (US); Katerina Hur, Sunnyvale, CA (US); Rebecca McTaggart, Merrimack, NH (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/872,286

(22) Filed: May 31, 2001

(65) Prior Publication Data

US 2001/0029073 A1 Oct. 11, 2001

Related U.S. Application Data

(62) Division of application No. 09/369,954, filed on Aug. 6, 1999, now Pat. No. 6,271,547.

(51) Int. Cl.$^7$ ............................................. H01L 21/338
(52) U.S. Cl. ..................... 438/167; 438/172; 438/576; 438/745
(58) Field of Search ................................ 257/192, 194, 257/195, 200, 276, 280–284, 472, 631, 778; 438/167–169, 172, 180, 571, 576, 578, 704, 705, 735, 745

(56) References Cited

U.S. PATENT DOCUMENTS

| 5,060,030 A | 10/1991 | Hoke | |
| 5,140,386 A | 8/1992 | Huang et al. | 357/22 |
| 5,270,228 A | 12/1993 | Ishikawa | |
| 5,285,087 A | 2/1994 | Narita et al. | 257/192 |

(List continued on next page.)

OTHER PUBLICATIONS

Broekaert et al., "AlAs Etch–Stop layers for InGaAlAs/InP Heterostructure Devices and Circuits", IEEE Transactions of electron devices, vol. 39, No. 3, p 533–536 (1992).*

Katerina Y. Hur et al.; Development of Double Recessed AlInAs/GaInAs/InP HEMTs for Millimeter Wave Power Applications; Solid–State Electronics; 1997; vol. 41, No. 10; pp. 1581–1585.

P. Ho et al.; Extremely High Gain, Low Noise InAlAs/InGaAs HEMTs Grown By Molecular Beam Epitaxy; 1988 IEEE; pp. 184–186.

K. Y. Hur et al.; "Ultralinear double pulse doped AlInAs/GaInAs/InP HEMTs"; Electronics Letters, Aug. 1, 1996; vol. 32, No. 16; pp. 1516–1518.

C.S. Whelan et al.; "Low Noise $In_{0.32}(AlGa)_{0.68}As/In_{0.43}Ga_{0.57}As$ Metamorphic HEMT on GaAs Substrate with 850 mW/mm Output Power Density"; IEEE Electron Device Letters, vol. 21, No. 1; Jan. 2000; pp. 5–8.

*Primary Examiner*—Michael Sherry
*Assistant Examiner*—Asok Kumar Sarkar
(74) *Attorney, Agent, or Firm*—Daly, Crowley & Mofford, LLP

(57) ABSTRACT

A transistor structure is provided. This structure has a source electrode and a drain electrode. A doped cap layer of $Ga_xIn_{1-x}As$ is disposed below the source electrode and the drain electrode and provides a cap layer opening. An undoped resistive layer of $Ga_xIn_{1-x}As$ is disposed below the cap layer and defines a resistive layer opening in registration with the cap layer opening and having a first width. A Schottky layer of $Al_yIn_{1-y}As$ is disposed below the resistive layer. An undoped channel layer is disposed below the Schottky layer. A semi-insulating substrate is disposed below the channel layer. A top surface of the Schottky layer beneath the resistive layer opening provides a recess having a second width smaller than the first width. A gate electrode is in contact with a bottom surface of the recess provided by the Schottky layer.

7 Claims, 4 Drawing Sheets

U.S. PATENT DOCUMENTS

| | | |
|---|---|---|
| 5,298,444 A | 3/1994 | Ristow |
| 5,300,795 A | 4/1994 | Saunier et al. |
| 5,364,816 A * | 11/1994 | Boos et al. .................. 438/172 |
| 5,436,470 A | 7/1995 | Nakajima .................... 257/24 |
| 5,448,084 A | 9/1995 | Hoke et al. |
| 5,504,353 A | 4/1996 | Kuzuhara ................... 257/194 |
| 5,548,138 A | 8/1996 | Tanimoto et al. |
| 5,548,140 A | 8/1996 | Nguyen et al. |
| 5,550,388 A | 8/1996 | Haruyama .................... 257/24 |
| 5,596,211 A | 1/1997 | Onda et al. |
| 5,641,977 A | 6/1997 | Kanamori ................... 257/192 |
| 5,663,583 A | 9/1997 | Matloubian et al. |
| 5,668,387 A | 9/1997 | Streit et al. |
| 5,721,161 A | 2/1998 | Nguyen et al. |
| 5,734,670 A | 3/1998 | Ono et al. |
| 5,811,843 A | 9/1998 | Yamamoto et al. ......... 257/194 |
| 6,144,048 A | 11/2000 | Suemitsu et al. ........... 257/192 |
| 6,144,049 A | 11/2000 | Onda ......................... 257/194 |
| 6,194,747 B1 | 2/2001 | Onda |
| 6,258,639 B1 * | 7/2001 | Rohdin et al. .............. 438/167 |
| 6,271,547 B1 | 8/2001 | Hoke et al. |

* cited by examiner

GATE ELECTRODE FORMATION IN DOUBLE-RECESSED TRANSISTOR BY TWO-STEP ETCHING

RELATED PATENT APPLICATIONS

This is a divisional of patent application Ser. No. 09/369,954 filed Aug. 6, 1999 now U.S. Pat. No. 6,271,547.

BACKGROUND OF THE INVENTION

This invention relates generally to high electron mobility transistors (HEMTs) and more particularly to transistors of such type which are fabricated with a double recess.

As is known in the art, there are several types of active devices used at microwave and millimeter frequencies to provide amplification of radio frequency signals. In general, one of the more common semiconductor devices used at these frequencies is the high electron mobility transistor (HEMT). Typically, HEMTs are formed from Group III–V materials such as gallium arsenide (GaAs) or indium phosphide (InP). In a HEMT there is a doped donor/undoped spacer layer of one material and an undoped channel layer of a different material. A heterojunction is formed between the doped donor/undoped spacer layer and the undoped channel layer. Due to the conduction band discontinuity at the heterojunction, electrons are injected from the doped donor/undoped spacer layer into the undoped channel layer. Thus, electrons from the large bandgap donor layer are transferred into the narrow bandgap channel layer where they are confined to move only in a plane parallel to the heterojunction. Consequently, there is spacial separation between the donor atoms in the donor layer and the electrons in the channel layer resulting in low impurity scattering and good electron mobility.

One device which has been found to provide good device characteristics such as breakdown voltage, output currents, and pinch-off voltage is a double recessed HEMT. Such a device is fabricated with two aligned recesses in which the gate is formed. The recesses are typically formed by wet etching the device. The etching process is periodically interrupted and the device is tested for certain characteristics, e.g., current. If the characteristics meet the desired criteria, then etching for that recess is terminated. Otherwise, the etching continues. This process continues until both recesses meet the established criteria. This process takes time and money to repeatedly stop the etching and test the device. Also, the etching is not uniform across the wafer, resulting in inconsistent device characteristics across the wafer and low yield of acceptable devices on the wafer.

SUMMARY OF THE INVENTION

In accordance with the present invention, a transistor structure is provided. This structure has a source electrode and a drain electrode. A doped cap layer of $Ga_xIn_{1-x}As$ is disposed below and in ohmic contact with the source electrode and the drain electrode and provides a cap layer opening. An undoped resistive layer of $Ga_xIn_{1-x}As$ is disposed below the cap layer and provides a resistive layer opening in registration with the cap layer opening and having a first width. A Schottky layer of $Al_yIn_{1-y}As$ is disposed below the resistive layer. An undoped channel layer is disposed below the Schottky layer. A semi-insulating substrate is disposed below the channel layer. A top surface of the Schottky layer beneath the resistive layer opening provides a recess having a second width smaller than the first width. A gate electrode is in contact with a bottom surface of the recess provided by the Schottky layer.

With such structure, uniform device characteristics such as breakdown voltage, output currents, and pinch-off voltage are achievable, as is a high yield of acceptable devices.

In accordance with another feature of the invention, a semiconductor structure is provided having a Schottky layer adapted to be etched at a first etch rate by an etchant. The semiconductor structure also has a contact layer disposed above the Schottky layer and adapted to be etched by the etchant at a second etch rate that is substantially faster than the first etch rate. The contact layer provides an opening exposing a region of a top surface of the Schottky layer, the region having a first width. The region of the top surface of the Schottky layer provides a recess of a second width smaller than the first width.

In a preferred embodiment of the invention, the Schottky layer contains aluminum, with an etch rate of about 0.1 Å/second relative to a succinic acid etchant, while the contact layer is substantially free of aluminum, having an etch rate of about 5 Å/second relative to succinic acid etchant. Such composition allows the transistor's contact layer to be selectively etched with succinic acid to form the opening while leaving the Schottky layer substantially intact. Thus, uniform device characteristics such as breakdown voltage, output currents, and pinch-off voltage can be achieved and a high yield of acceptable devices produced.

In accordance with another feature of the invention, a transistor structure is provided having a Schottky layer adapted to be etched at a first etch rate by an etchant and a contact layer disposed above the Schottky layer and adapted to be etched by the etchant at a second etch rate that is substantially faster than the Schottky layer's first etch rate. In this structure, a region above a portion of a top surface of the Schottky layer is substantially free of the contact layer. The portion of the top surface of the Schottky layer has a first width and provides a recess having a second width smaller than the first width and adapted to receive a gate electrode.

In a preferred embodiment of the invention, the Schottky layer comprises at least about 35 percent Aluminum and the contact layer comprises less than about ten percent Aluminum.

In accordance with another feature of the invention, a method of forming a semiconductor is provided. The method includes forming a Schottky layer adapted to be etched by a first etchant at a first etch rate and forming a contact layer above the Schottky layer adapted to be etched by the first etchant at a second etch rate that is substantially faster than the first etch rate. The first etchant is applied to etch the contact layer to expose a portion of the Schottky layer. A second etchant is applied to etch the portion of the Schottky layer exposed by the first etchant.

In a preferred embodiment of the invention, the Schottky layer contains Aluminum while the contact layer is substantially free of Aluminum. Further, the first etchant includes a carboxylic-acid based wet etchant.

Embodiments of the invention may provide one or more of the following advantages. The invention saves time and money in manufacturing HEMTs. It also eliminates or decreases the need to etch a device and periodically test the device for certain characteristics. Uniformity of device characteristics on a wafer can be improved.

Other advantages will be apparent from the following description and from the claims.

DESCRIPTION OF PREFERRED EMBODIMENTS

Figure 1:
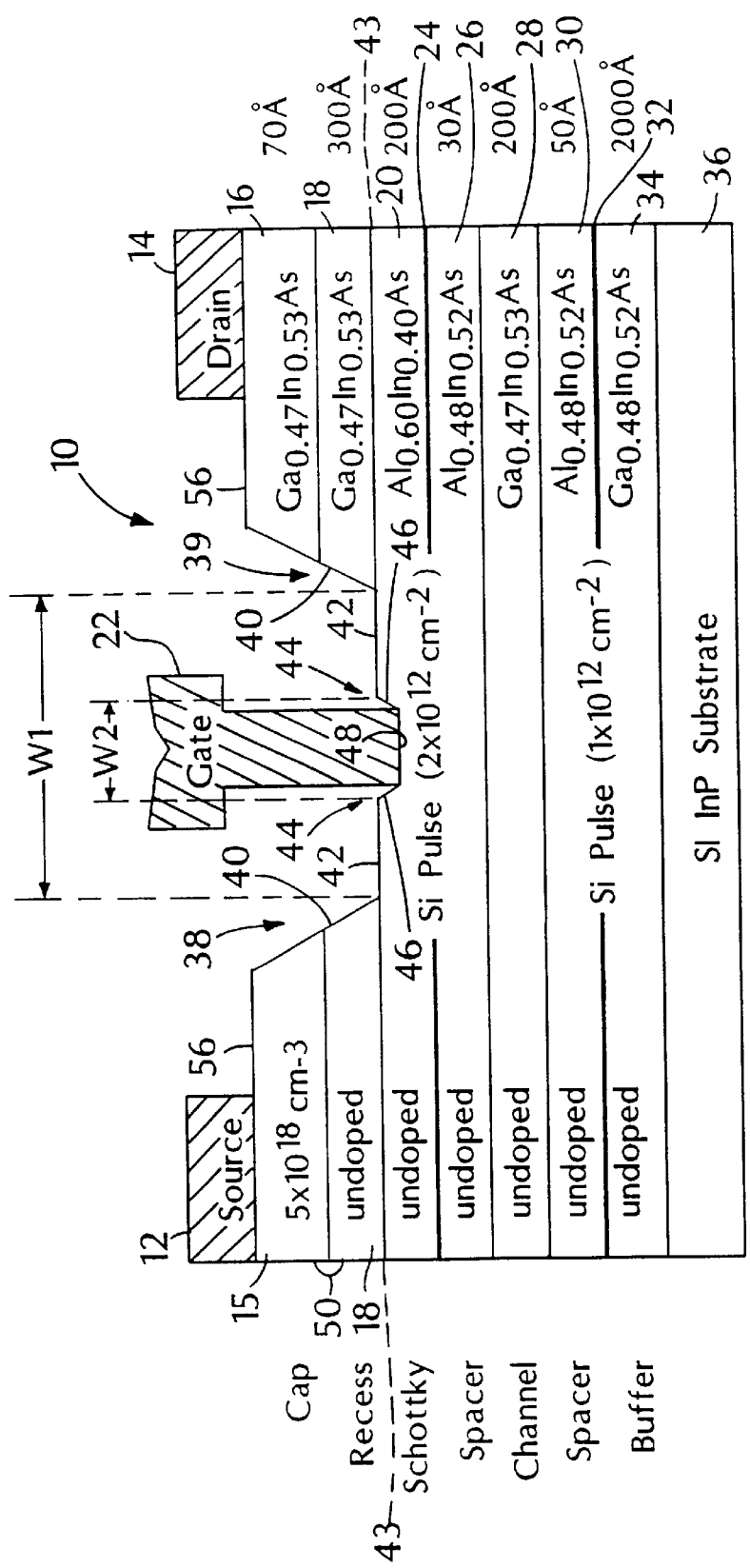
FIG. 1 is a cross sectional diagrammatical sketch of a double recessed HEMT according to the invention.

Referring now to FIG. 1, a high electron mobility transistor (HEMT) 10 is shown. Here, transistor 10 has a source electrode 12 and a drain electrode 14. The electrodes 12 and 14 are in ohmic contact with a cap layer 16. The cap layer 16 here is $Ga_{0.47}In_{0.53}As$, about 70 Å thick, and has a doping concentration of about $5 \times 10^{18}$ cm$^{-3}$. Disposed below the cap layer 16 is a recess or resistive layer 18. The resistive layer 18 here is $Ga_{0.47}In_{0.53}As$, about 300 Å thick, and undoped. The cap and resistive layers 16 and 18 form a contact layer 50. Disposed below the resistive layer 18 is a Schottky layer 20, here undoped $Al_{0.60}In_{0.40}As$ about 200 Å thick. The cap and resistive layers 16, 18 provide an opening 38 from a surface 56 to a top surface 42 of the Schottky layer 20. The top surface 42 of the Schottky layer 20 provides a recess 44 with a bottom surface 48. In Schottky contact with the Schottky layer 20 at the bottom surface 48 is a gate electrode 22. A doped pulse layer 24 is disposed below the Schottky layer 20. Here the pulse layer 24 is silicon and has a doping concentration of about $2 \times 10^{12}$ cm$^{-2}$. Disposed below the pulse layer 24 is a spacer layer 26. The spacer layer 26 here is $Al_{0.48}In_{0.52}As$, about 30 Å thick, and undoped. Disposed below the spacer layer 26 is a channel layer 28. The channel layer 28 here is $Ga_{0.47}In_{0.53}As$, about 200 Å thick, and undoped. A second spacer layer 30 is disposed below the channel layer 28. Here the spacer layer 30 is $Al_{0.48}In_{0.52}As$, about 50 Å thick, and undoped. Disposed below the spacer layer 30 is a second pulse layer 32. Here the pulse layer 32 is silicon and has a doping concentration of $1 \times 10^{-12}$ cm$^{-2}$, providing a silicon pulse ratio of 2:1 between the first pulse layer 24 and the second pulse layer 32 to help linearize the performance of the transistor 10. Disposed below the pulse layer 32 is a buffer layer 34. The buffer layer 34 here is $Al_{0.48}In_{0.52}As$, about 2000 Å thick, and undoped. Disposed below the buffer layer 34 is a semi-insulating InP substrate 36.

The Schottky layer 20 can be undoped, as shown, or doped. An undoped Schottky layer provides a higher breakdown voltage than with a doped Schottky layer 20. A doped Schottky layer 20 reduces resistance which lowers the breakdown voltage and increases conduction compared to an undoped Schottky layer 20.

As shown, transistor 10 has a double recess structure including a first recess 39, formed by the opening 38 and the top surface 42 of the schottky layer 20, and the second recess 44. The first recess 39 is provided by the cap layer 16 and the resistive layer 18. Side walls 40 of the first recess 39 are provided by the cap and resistive layers 16, 18 from the surface 56 to the top surface 42 of the Schottky layer 20. The first recess 39 exposes a first width W1 of the Schottky layer 20 at a top level 43 of the Schottky layer 20. The second recess 44 has a second width W2 at the bottom surface 48, the width W2 being smaller than the width W1. The second recess 44 is provided by the top surface 42 of the Schottky layer 20 and has side walls 46 extending from the top 43 of the Schottky layer 20 to the bottom surface 48.

The cap and resistive layers 16, 18 have different material composition than the Schottky layer 20. The Schottky layer 20 includes Group III–V material, here aluminum and indium. Sixty percent of the Group III–V material in the Schottky layer 20 is aluminum and forty percent is indium. To provide desirable device characteristics, there is preferably at least 35 percent aluminum in the Schottky layer 20, and less than about ten percent aluminum in the cap and resistive layers 16, 18. The cap and resistive layers 16, 18 are preferably substantially free of Aluminum, though they can contain up to about ten percent Aluminum and still provide desirable device characteristics.

The cap and resistive layers 16, 18 have a different etch rate than the Schottky layer 20 to provide etch selectivity. The Schottky layer 20 is adapted to be etched at a first etch rate by an etchant. The $Al_{0.60}In_{0.40}As$ Schottky layer 20 shown has an etch rate of about 0.1 Å/second when exposed to an etchant of succinic acid, which is a carboxylic-acid based wet etchant. The cap and resistive layers 16, 18 are adapted to be etched by the etchant at a second etch rate that is substantially faster than the first etch rate. The $Ga_{0.47}In_{0.53}As$ layers 16, 18 have etch rates of about 5 Å/second when etched by succinic acid.

Figure 2:
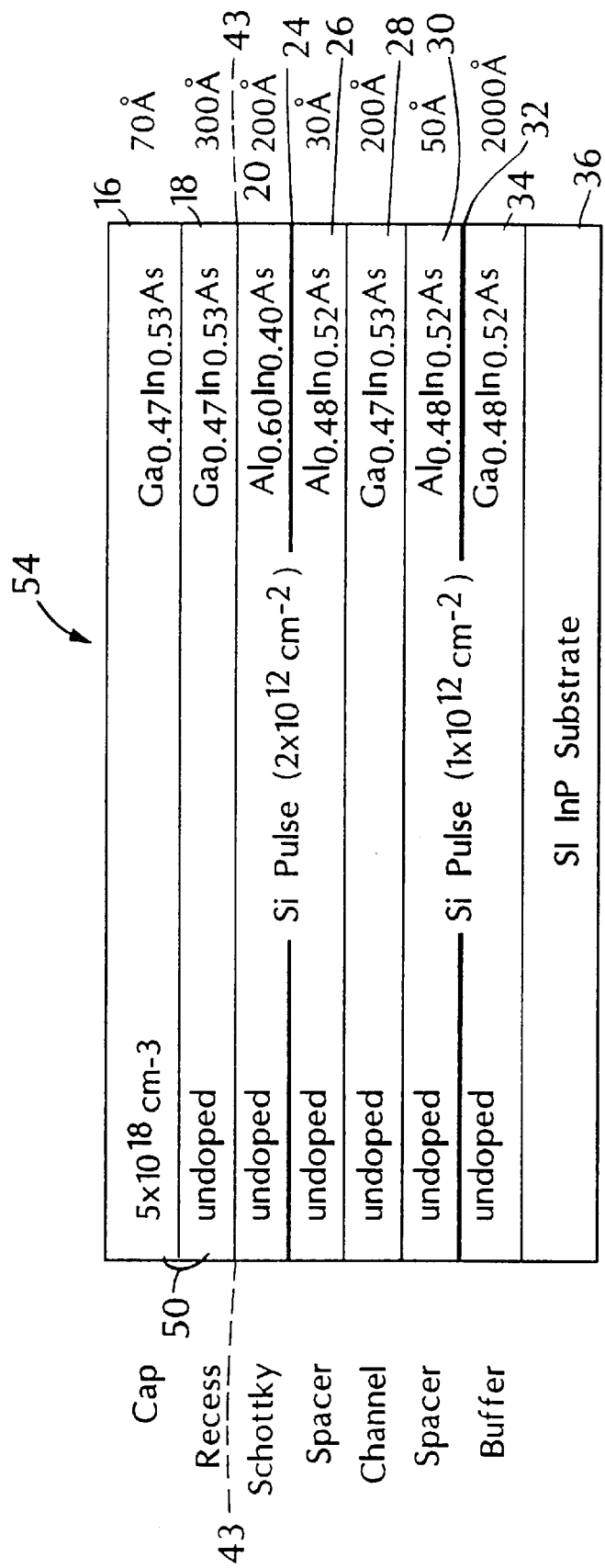
FIGS. 2–4 are cross sectional diagrammatical sketches of the double recessed HEMT of FIG. 1 in various stages of manufacture.
Figure 3:
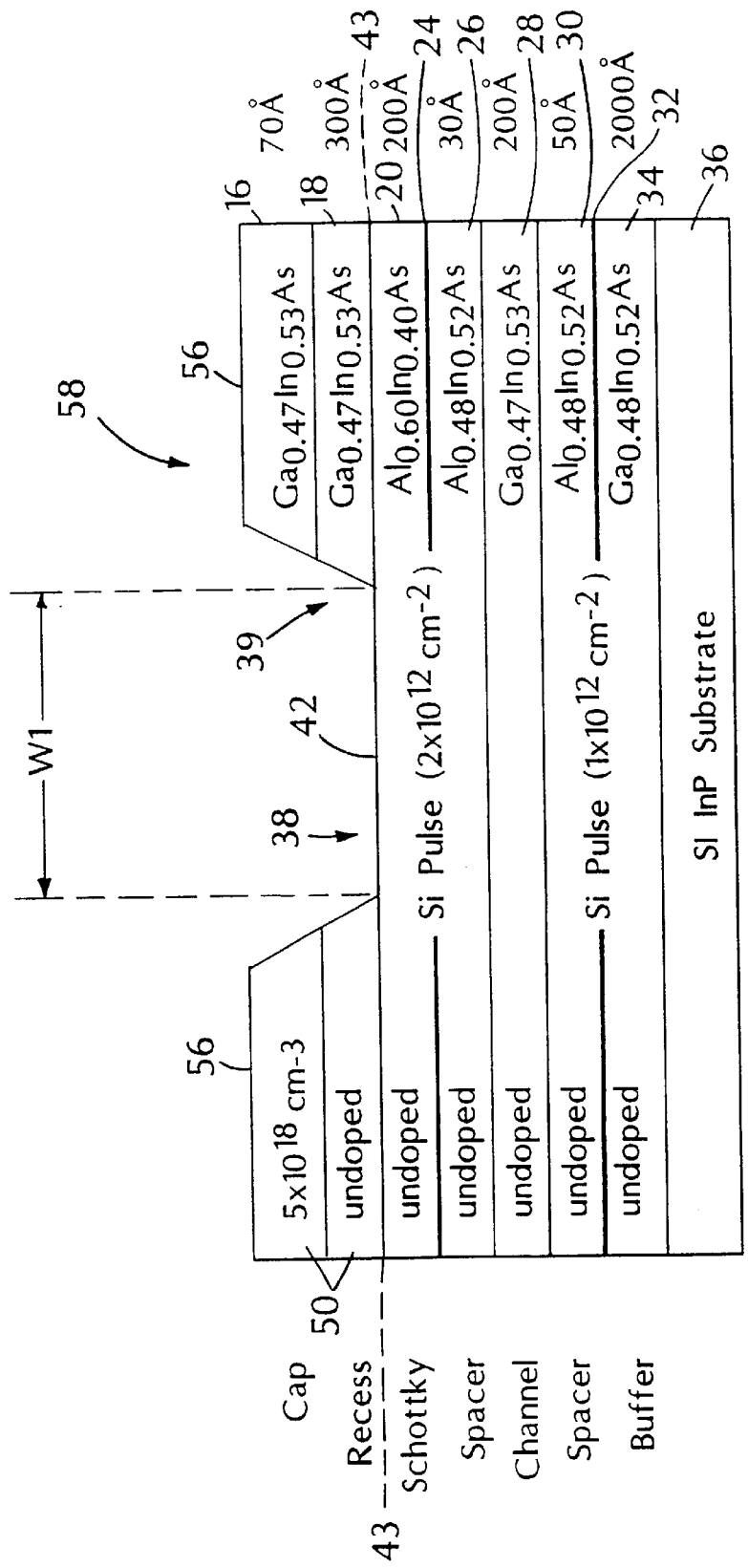
Figure 4:
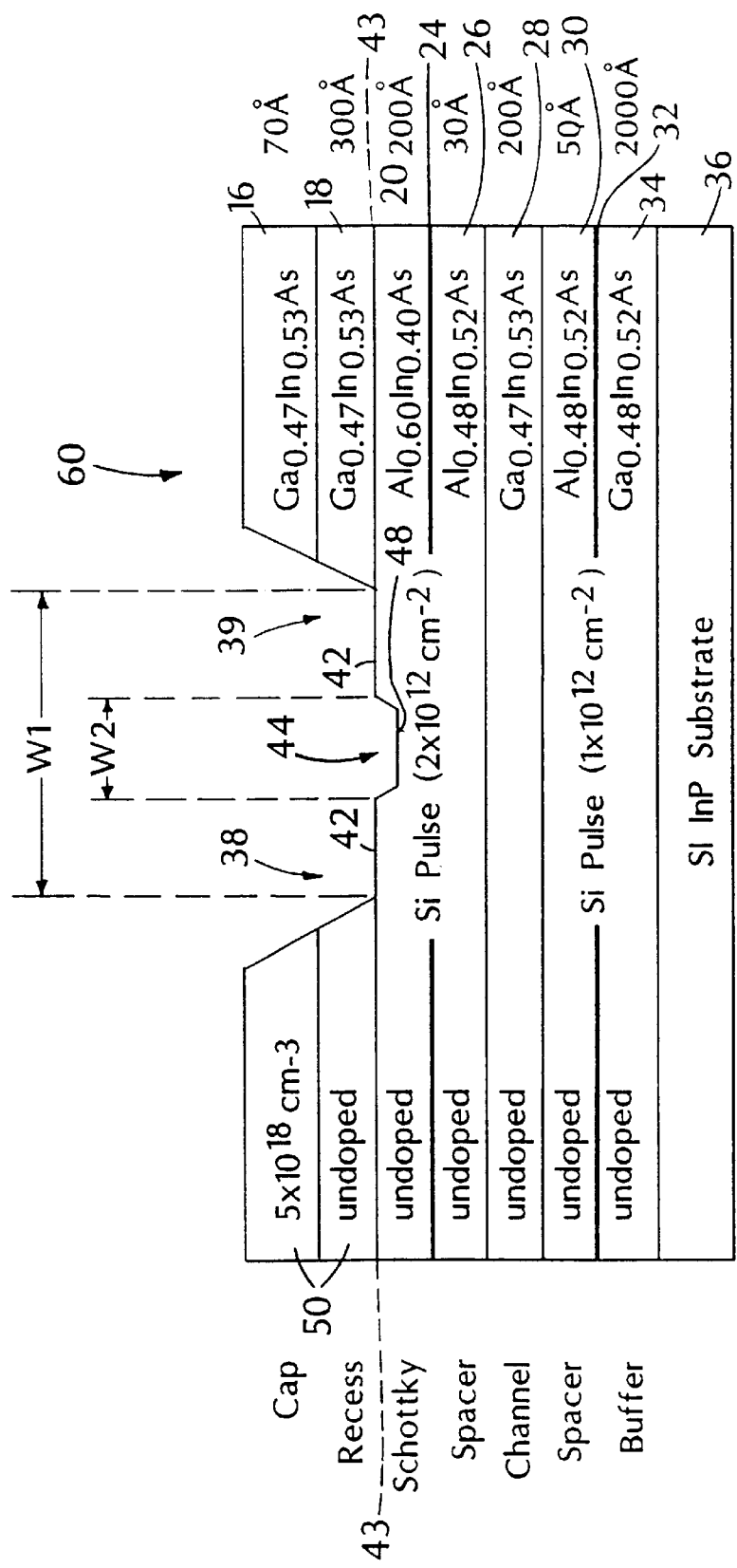

A method of forming a semiconductor device such as transistor 10 is now described, referring to FIGS. 1–4. FIG. 2 shows the forming of layers 16, 18, and 20. FIGS. 3 and 4 show the etching of layers 16, 18, and 20. FIG. 1 shows the finished transistor 10.

The method of forming transistor 10 in FIG. 1 includes forming the Schottky layer 20 and the cap and resistive layers 16, 18 above the Schottky layer 20. An etchant is applied to the cap and resistive layers 16, 18 to etch them and expose the top surface 42 of the Schottky layer 20. Another etchant is applied to etch the exposed top surface 42 of the Schottky layer 20 to produce the recess 44.

Referring to FIG. 2, forming the semiconductor layers 16, 18, and 20 is now described. As shown in FIG. 2, the substrate 36 is provided and the buffer layer grown on the substrate 36 by molecular beam epitaxy (MBE). Over the buffer layer 34 the pulse layer 32 is grown by MBE and doped by silicon. Over the pulse layer 32 the spacer layer 30, the channel layer 28, and the spacer layer 26 grown by MBE. Over the spacer layer 26 the pulse layer 24 is grown by MBE and doped by silicon. Over the pulse layer 24 the Schottky layer 20 is grown by MBE. Referring now to FIG. 3, the contact layer 50, including the cap layer 16 and the resistive layer 18, is formed by MBE on the Schottky layer 20 to complete the formation of an intermediate structure 54. A wet etch process for mesa isolation is performed by applying 1:8:160 $H_2SO_4:H_2O_2:H_2O$ for about 20 seconds to define the mesa. Then, 6:1 succinic acid:$H_2O_2$ is applied for about 90 seconds to selectively etch back the InGaAs channel layer 28. This forms a channel notch (not shown) to help prevent shorting of the channel layer 28 to the gate electrode 22 via a conductor (not shown) running up the side of the mesa.

Referring to FIGS. 3 and 4, etching the intermediate structure 54 is now described. As shown in FIG. 3, a first etchant, here a carboxylic-acid based wet etchant, specifically 6:1 succinic acid:$H_2O_2$ is applied to the top surface 56 of the cap layer 16. Electron beam lithography is used with the succinic acid and the succinic acid is applied for enough time, e.g., about 60 seconds, to etch the contact layer 50 at the second etch rate to form the opening 38. This exposes the top surface 42 of the Schottky layer 20, selectively forms the first recess 39, and completes the formation of an intermediate structure 58. Because the first etch rate of the Schottky layer 20 is substantially slower than the second etch rate of the contact layer 50 in response to the succinic acid, the succinic acid essentially does not etch the Schottky layer 20. The first etch is a selective etch.

Now referring to FIG. 4, intermediate structure 58 is etched. A second etchant, e.g., 1:1:100 $H_3PO_4$:$H_2O_2$:$H_2O$ is applied to a portion of the top surface 42 of the Schottky layer 20 exposed by the succinic acid for enough time to etch the Schottky layer 20, e.g., 10 seconds. This etching forms the second recess 44, and completes the formation of intermediate structure 60.

Referring to FIG. 1, electrodes 12, 14, and 22 are added to the intermediate structure 60 to complete the transistor 10. The source and drain electrodes 12 and 14 are in ohmic contact with the top surface 56 of the cap layer 16. These ohmic contacts for the source and drain electrodes 12 and 14 are fabricated using a 900 Å AuGe-2000 Å Au metallurgy at 375° C. The gate electrode 22 is in Schottky contact with the bottom surface 48 of the Schottky layer 20. The gate electrode is formed by depositing a resist layer, not shown, exposing the recess 44. Schottky metal of 500 Å Ti-500 Å Pt-4000 Å Au is deposited over the resist layer on the recess 44. The resist layer is lifted off to remove unwanted metal, leaving the gate electrode 22.

The transistor 10 shown in FIG. 1 has been fabricated and tested. The transistor 10 had a typical carrier sheet density of about $3 \times 10^{12}$ $cm^{-2}$, Hall mobility of 8300 $cm^2$/V-sec at room temperature, maximum output current in the range 590–640 mA/mm, and breakdown voltage in the range 12.3–14.4 V.

Other embodiments are within the spirit and scope of the appended claims. For example, the contact layer 50 can be a single layer, doped or undoped.

What is claimed is:

1. A method of forming a semiconductor comprising:

forming a Schottky layer adapted to be etched by a first etchant at a first etch rate;

forming a contact layer above the Schottky layer adapted to be etched by the first etchant at a second etch rate;

applying the first etchant to etch the contact layer to expose a portion of the Schottky layer; and applying a second etchant to etch the portion of the Schottky layer exposed by the first etchant;

wherein second etch rate is substantially faster than the first etch rate when using the first etchant.

2. The method recited in claim 1 wherein the Schottky layer contains Aluminum.

3. The method recited in claim 2 wherein the Schottky layer comprises about 35 percent Aluminum.

4. The method recited in claim 3 wherein the contact layer is substantially free of Aluminum.

5. The method recited in claim 3 wherein the first etchant includes a carboxylic-acid based wet etchant.

6. The method recited in claim 5 wherein the first etchant is succinic acid.

7. The method recited in claim 3 wherein the second etchant is applied for a predetermined time.

* * * * *

UNITED STATES PATENT AND TRADEMARK OFFICE
CERTIFICATE OF CORRECTION

PATENT NO. : 6,573,129 B2 Page 1 of 1
DATED : June 3, 2003
INVENTOR(S) : Hoke et al.

It is certified that error appears in the above-identified patent and that said Letters Patent is hereby corrected as shown below:

Column 3,
Line 34, delete "of $1 \times 10^{-12}$" and replace with -- of $1 \times 10^{12}$ --

Column 4,
Line 38, delete "layer 26 grown" and replace with -- layer 26 is grown --

Signed and Sealed this

Twenty-sixth Day of August, 2003

JAMES E. ROGAN
*Director of the United States Patent and Trademark Office*